(12) United States Patent
Menke et al.

(10) Patent No.: US 8,703,333 B2
(45) Date of Patent: *Apr. 22, 2014

(54) ELECTRODE COMPOSITIONS AND PROCESSES

(75) Inventors: Erik Menke, Merced, CA (US); Grant Umeda, Los Angeles, CA (US); Brittnee Veldman, Blue Jay, CA (US); Bruce Dunn, Los Angeles, CA (US); Fred Wudl, Santa Barbara, CA (US); Monique Nathalie Richard, Ann Arbor, MI (US); Kimber Lee Stamm, Ann Arbor, MI (US)

(73) Assignees: Toyota Motor Engineering & Manufacturing North America, Inc., Erlanger, KY (US); The Regents of the University of California, Oakland, CA (US)

( * ) Notice: Subject to any disclaimer, the term of this patent is extended or adjusted under 35 U.S.C. 154(b) by 383 days.

This patent is subject to a terminal disclaimer.

(21) Appl. No.: 12/395,488

(22) Filed: Feb. 27, 2009

(65) Prior Publication Data

US 2010/0221611 A1 Sep. 2, 2010

(51) Int. Cl.
*H01M 4/13* (2010.01)
*B05D 5/12* (2006.01)

(52) U.S. Cl.
USPC ... 429/218.1; 429/245; 429/137; 429/231.95; 429/233; 429/317; 429/231.6; 427/123

(58) Field of Classification Search
CPC ............ H01M 10/052; H01M 2/0287; H01M 10/0525; H01M 2004/027; H01M 2/021; H01M 4/1395; H01M 4/0421; H01M 4/0404
USPC ......... 429/245, 137, 231.95, 233, 317, 218.1, 429/231.6; 427/123

See application file for complete search history.

(56) References Cited

U.S. PATENT DOCUMENTS

| | | | |
|---|---|---|---|
| 6,025,094 A | 2/2000 | Visco et al. | |
| 7,247,408 B2 | 7/2007 | Skotheim et al. | |

(Continued)

FOREIGN PATENT DOCUMENTS

EP 1 662 592 A1 7/2004

(Continued)

OTHER PUBLICATIONS

JP 2005_032731 MT.*

(Continued)

*Primary Examiner* — Patrick Ryan
*Assistant Examiner* — Alex Usyatinsky
(74) *Attorney, Agent, or Firm* — Christopher G. Darrow; Young Basile

(57) ABSTRACT

A composition for use in an electrochemical cell is disclosed wherein the composition includes a clean metal substantially free of impurities and a layer of protective material in contact with the clean metal. Further disclosed is an electrochemical cell including a metal film comprising a clean metal substantially free of impurities. The electrochemical cell may further include an electrolyte and a layer of protective material disposed between the electrolyte and the metal film. A process for manufacturing an electrode is further disclosed including preparing a metal film comprising a clean metal substantially free of impurities and depositing a layer of protective material on to the metal film.

23 Claims, 2 Drawing Sheets

(56) References Cited

U.S. PATENT DOCUMENTS

| | | | |
|---|---|---|---|
| 7,282,296 B2* | 10/2007 | Visco et al. | 429/137 |
| 7,629,083 B2* | 12/2009 | Cho et al. | 429/231.95 |
| 2004/0209159 A1* | 10/2004 | Lee et al. | 429/137 |
| 2005/0089759 A1* | 4/2005 | Hwang et al. | 429/245 |
| 2006/0286448 A1 | 12/2006 | Snyder et al. | |
| 2009/0246631 A1* | 10/2009 | Hojo et al. | 429/213 |

FOREIGN PATENT DOCUMENTS

| | | | |
|---|---|---|---|
| JP | 2005-032731 | 2/2005 | |
| JP | 2005 032731 | * | 2/2005 |
| KR | 1020050038905 | 4/2005 | |
| KR | 1020050052920 | 6/2005 | |
| KR | 100508945 | 8/2005 | |

OTHER PUBLICATIONS

International Search Report and Written opinion for International Application No. /PCT/US2010/000636 mailed Oct. 4, 2010; 4 pages.

J. Hauser et al., Physical Review B, (1978), 18(8), pp. 3890-3996.

\* cited by examiner

ELECTRODE COMPOSITIONS AND PROCESSES

TECHNICAL FIELD

The present disclosure relates generally to the field of electrodes for use in electrochemical cells. More specifically, but without limitation, the present disclosure relates to electrodes for use in electrochemical cells comprising a protective layer and processes of forming such electrodes and electrochemical cells.

BACKGROUND

The improvement of metal containing anodes has been of particular interest in the development of electrochemical cells such as batteries, for example. Lithium (Li) metal, as one example, may be particularly useful as the anode of electrochemical cells because of its relatively light weight and high energy density, as compared to other types of anode materials (e.g., carbon, metals). Automobiles to portable electronic devices (e.g., laptops, cellular phones) may include batteries which comprise lithium anodes. Historically, lithium anodes in electrochemical cells experience decreased performance with power cycling, the decreased performance resulting from self discharge. As a result, lithium anodes have not been adopted for commercial rechargeable batteries.

Published literature has shown that the surface of lithium metal may be covered by various Li-salts, including (but not limited to) carbonate, oxide, hydroxide. The surface layer on the lithium metal, which may be non-homogenous in thickness and composition, which may lead to uneven current distribution across the lithium surface, during plating and/or stripping. As a result of this inhomogeneous current distribution, the surface layer under the Li-salts may become non-uniform or roughen with successive cycles charge/discharge. In extreme cases, non-uniformity of the lithium surface may result in mossy lithium (i.e., lithium not connected to the current collector) or dendrites. Either case may result in reduced battery performance, although the latter is also a potential source of battery self-discharge and even thermal runaway.

Numerous solutions have been proposed to prevent the formation of mossy and/or dendritic deposits on the lithium surface, including the addition of polymers and other protective layers and formation of dense layers on the lithium surface by chemical treatment, either in-situ or ex-situ. Despite various approaches to improve metal anodes, a need remains for processes and compositions to improve the homogeneity of metal anode surfaces and thus, increase performance of electrochemical cells.

SUMMARY

The following presents a general summary of several aspects of the disclosure in order to provide a basic understanding of the disclosure. This summary is not an extensive overview of the disclosure nor is it intended to identify key or critical elements of the disclosure or to delineate the scope of the claims. The following summary merely presents some concepts of the disclosure in a general form as a prelude to the more detailed description that follows.

One aspect of the disclosure provides a composition for use in an electrochemical cell. The composition includes a clean metal substantially free of impurities and a layer of protective material in contact with the clean metal.

Another aspect of the disclosure provides an electrochemical cell including a metal film comprising a clean metal substantially free of impurities. The electrochemical cell may further include an electrolyte and a layer of protective material disposed between the electrolyte and the metal film.

Yet another aspect of the present disclosure provides a process for manufacturing an electrode including preparing a metal film comprising a clean metal substantially free of impurities and depositing a layer of protective material on to the metal film.

BRIEF DESCRIPTION OF THE DRAWINGS

For detailed understanding of the present disclosure, references should be made to the following detailed description of the several aspects, taken in conjunction with the accompanying drawings, in which like elements have been given like numerals and wherein.

DETAILED DESCRIPTION

Figure 1:
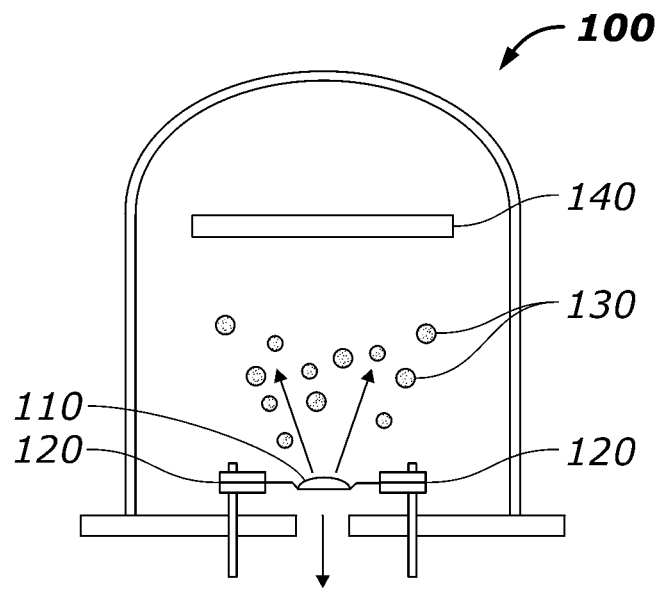
FIG. 1 illustrates an apparatus for forming a metal film via vapor deposition.

Before the present compositions and processes are described, it is to be understood that this disclosure is not limited to the particular compositions and processes described, as such may vary. One of ordinary skill in the art should understand that the terminology used herein is for the purpose of describing possible aspects, embodiments and/or implementations only, and is not intended to limit the scope of the present disclosure which will be limited only by the appended claims. For example, to one of ordinary skill in the art, it will be readily apparent that a process for treating a metal surface may be implemented in a variety of ways utilizing different compositions, parts or any suitable variety of components, and that the forgoing discussion of certain of these implementations does not necessarily represent a complete description of all possible implementations.

It must also be noted that as used herein and in the appended claims, the singular forms "a," "and," and "the" may include plural referents unless the context clearly dictates otherwise. Thus, for example, reference to "a layer" refers to one or several layers, and reference to "a method of preparing" includes reference to equivalent steps and methods known to those skilled in the art, and so forth.

For simplicity and clarity of illustration, the drawing and/or figures illustrate the general manner of construction, and descriptions and details of well known features and techniques may be omitted to avoid unnecessarily obscuring the disclosure.

The following processes described below or any suitable metal cleaning technique as is known in the art may be utilized to produce a "clean metal" surface, generally referred to as a condition whereby the resulting metallic surface is substantially free of carbonate, oxide and hydroxide components or other impurities typically found on a battery grade metal received from a manufacturer. Impurities found on a battery grade metal from a manufacturer may comprise about 20% to 80% carbon and/or about 10% to 35% oxygen. The difficulties or decreased performance of electrochemical cells, as a result of deposit formation on the metal surface during charge/discharge cycling for example, may be solved by the use of a clean metal surface followed by the addition of a protective layer.

One layer in an electrochemical cell may be an anode comprising a clean metal, such as lithium, as the anode active material. The lithium (Li) metal may be in the form of a lithium metal foil or a thin lithium film that has been deposited on a substrate, as will be described below. If desirable for the electrochemical properties of the cell, the lithium metal may be in the form of a lithium alloy such as, for example, a lithium aluminum alloy. Further, the thickness of the lithium metal layer may be any suitable thickness and may vary from about 5 nanometers (nm) to 50 microns.

While the present disclosure has been described within context of a lithium metal anode as an example, the compositions and processes disclosed are also applicable to other metal anodes such as sodium (Na), magnesium (Mg) and aluminum (Al).

In one implementation of an anode, a layer of a protective material may be deposited to the clean metal. The protective material may comprise an organic component, inorganic component or combination of organic/inorganic components. In one implementation, the protective material may comprise an organic component such as a polymer. Suitable polymers for use in the protective material may include, but are not limited to, ionically conductive polymers, sulfonated polymers, hydrocarbon polymers, vinyl polymer, cyanoacrylate based polymers, conjugated polymers such as poly p-phenylene, polyacetylene, polyphenyl vinylene, polyazulene, polyperinapthalene, polyacenes, oxalates (e.g., diethyl oxalates, dimethyl oxalates, dipropyl oxalates, etc.) polysiloxanes, polyphosphagens, polytetrafluoroethylenes, polyvinylpuridine, polyvinyl quinoline, poly-2-vinylpyridine, vinyl naphthalene, polyvinylidene fluorides, polyethylene oxide, vinylidene fluoride-hexafluoropropylene copolymers, tetrafluoroethylene-fluoropopylene copolymers, polychlorofluoroethylene, perfluoroalkoxy copolymers, polyfluorocyclic ethers, polyacrylonitriles, polymethylmethacrylates, polyetherpolymeric film having ether linkages (e.g., Polyethersulfone) or the like. The polymeric material may also be one that includes phosphorus (P) or nitrogen (N) such as, for example, acrylates or polyacrylates, polyphosphazene, or polyglycols. For example, the acrylates may include an ultraviolet curable acrylate or diacrylate (e.g., Tetraethylene Glycol Diacrylate, Polyethylene Glycol 200 Diacrylate, Polyethylene Glycol 400 Diacrylate, Polyethylene Glycol 200 Dimethacrylate, Polyethylene Glycol 400 Dimethacrylate, Polyethylene Glycol 600 Dimethacrylate, Polyethylane Glycol 200 Diacrylate, N-Vinyl-2-Pyrrolidone, Acrylonitrile, Diethylaminoethyl Acrylate, Diethylaminoethyl Methacrylate, Diisopropylaminoethyl Methacrylate, Dimethylaminopropyl Methacrylamide, and Methoxyethyl Acrylate). Further examples of applicable polymers may include linear polymers selected from polyether, polycarbonate, polyamide, polyester, polyvinyl chloride, polyvinylidene fluoride, polyimide, polycarbonxylate, polysulfonate, polyvinyl alcohol, polysulfone, polystyrene, polyethylene, or polypropylene-based polymers. Further, the suitable polymer or polymeric material may be any derivative, copolymer of or mixture of the aforementioned.

Any suitable polymer or polymeric material of the present disclosure may be formed by any conventional polymerization of one or more monomers selected from alkyl acrylates, glycol acrylates, polyglycol acrylates, polyol polyacrylates, or the like. Further, polymers or polymeric material may be formed by cross-linking monomers selected from the group of polyethylene oxide diacrylate, polyethylene oxide dimethacrylate, polypropylene oxide diacrylate, polypropylene oxide dimethacrylate, polymethylene oxide diacrylate, polymethylene oxide dimethacrylate, alkyldiol diacrylate, alkyldiol dimethacrylate, divinylbenzene, derivates or mixtures thereof. The selection of the polymer, polymeric material and/or monomer may be dependent on a number of factors including, but not limited to, the properties of electrolyte, anode and cathode used in the cell.

In other implementations, the protective material layer may comprise an inorganic component selected from a silicate, borate, aluminate, iodide, bromide, chloride, nitride, sulfide, phosphate, carbonate, phosphorus oxynitride, titanium oxide, borosulfide, aluminosulfide, and phosphosulfide, or a derivative or combination thereof. For example, the inorganic protective material layer may include anions or salts of a metal such as $Li_2O$, $SiO_2$, $B_2O_3$, $Al_2O_3$, $Na_2O$, $Li_2CO_3$, LiF, LiN, $Li_2S$, LiOH, $Li_3N$, $Li_3P$, LiI, LiBr, LiCl, LiF, LiPON, $P_2S_5$, $P_4S_3$, $TiO_2$, $BaTiO_2$, $Ba_2O_3$ or the like. The protective material may be selected for its ability to conduct ions and/or allow tunneling while limiting the conduction of electrons.

The thickness of the protective material layer is selected to provide the necessary protection to the clean metal layer. It may be desirable to keep the layer thickness as thin as possible while providing the desired degree of protection so as to not add excess amounts of non-active materials to the electrochemical cell which would increase the weight of the cell and reduce its energy density. Further, thin layers of protective material may exhibit faster ion conduction as compared to thicker layers of the same protective materials. To that end, the thickness of the protective material layer may be any suitable thickness and may vary from about 2 nanometers (nm) to 100 microns according to one implementation and from about 10 microns to 50 microns in another implementation. Further, he protective material may be disposed between the clean metal surface and an electrolyte.

Various methods of preparing a clean metal or clean metal film are contemplated by the present disclosure including, but not limited to sputtering deposition/processes, ion plating processes, extrusion, electroplating known vapor deposition processes, such as plasma or chemical vapor deposition (CVD) processes. Additional methods may include vacuum deposition techniques and may include treatment of a metal surface with reactive materials in the liquid or gas state to produce a clean metal surface.

It is further contemplated that numerous methods are applicable to treat the clean metal layer (i.e., to apply a protective material). It should be understood, however, that in the various methods used to treat the clean metal, the clean metal may not be exposed to temperature ranges substantially exceeding its melting temperature. For example, in the case of depositing a protective material to clean lithium, the lithium is not exposed to temperatures exceeding its melting point of 180° C.

As shown in FIG. 1, vapor deposition is one possible technique employed to produce a clean metal surface. In the vapor deposition process as shown, a metal precursor 110 may be heated under vacuum within a sterile environment such as a vacuum chamber 100 to limit the exposure of metal to little or no contaminants. Although a vacuum chamber 100 is shown for the purpose of illustration, the present disclosure also contemplates other sterile or inert environments such as a glove box or the like.

The metal precursor 110 may be lithium (Li), sodium (Na), magnesium (Mg) or aluminum (Al) in a relatively untreated of unpurified form. Typically, any of the aforementioned metal precursors may exist in a raw form as received from a manufacturer.

During vapor deposition, the metal precursor 110 may be heated to its melting temperature by a heating means such as electrodes 120. One of skill in the art would appreciate that other conventional heating means may be employed to raise the temperature of the metal precursor 110 to approximately its melting point. The temperature range at which the metal precursor 110 is heated varies depending on its melting point. For example, vapor deposition of lithium may occur at or near the melting point of lithium and thus, at a temperature range of at least 180° C.

When heated to its melting point, the metal precursor 110 may melt, boil or atomize and release particles of clean metal 130 throughout the vacuum chamber 100. Impurities found within or on the surface of the metal precursor 110 typically have higher melting points as compared to the metal precursor 110. Thus, the impurities do not melt but rather stay in contact with the metal precursor 110. Impurities generally associated with the aforementioned metals may include oxides, nitrides, alkyls, carbonates, a combination thereof or the like.

The vaporized particles of clean metal 130 may be released (e.g., ejected) from the metal precursor 110 and contacted with a substrate 140 disposed within the vacuum chamber 100. Typically, a suitable substrate 140 used for vapor deposition may be any conventional material/metal such as nickel (Ni), titanium (Ti), for example, which does not alloy with the clean metal. In the case of vapor deposition of lithium, a non-lithium alloy may be used as a substrate, whereas a non-sodium alloy may be used as the substrate for vapor deposition of sodium, and so on. Further, the substrate 140 may be any suitable electronic conductor.

Figure 2:
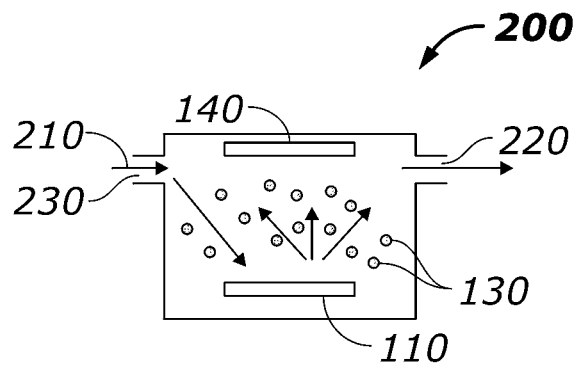
FIG. 2 illustrates an apparatus for forming a metal film via sputter deposition.

Turning now to FIG. 2, sputter deposition is shown as another technique used to produce a clean metal surface. Sputter deposition or sputtering may also be known as physical vapor deposition (PVD) whereby particles in a metal precursor 110, such as lithium, for example, are ejected into gas phase due to bombardment of the metal precursor 110 by energetic ions or sputtering gas 210.

Typically, a sterile environment 200 for sputter deposition may comprise an inlet 230 and an outlet 220 for the introduction of sputtering gas 210. Sputtering gases 210 used are typically inert gases or gases which do not react with the metal precursor 110. Examples of possible sputtering gases include, but are not limited to, helium, neon and argon. The sputtering gas may be a single type of gas or a combination of gases, such as a reaction gas and carrier gas, which may be introduced into the sterile environment 200.

During sputter deposition, the sputtering gas 210 bombards the metal precursor 110, causing particles of clean metal 130 to be released from the precursor 110 and deposit onto a substrate 140. Further, sputtering may occur with the bombardment of the metal precursor 110 by energized particles of gas at a high rate of speed. Thus, particles of clean metal 130 which are released from the precursor 100 are drawn by a magnetic field to the substrate 140. The substrate 140 employed in a sputter deposition may have characteristics and properties as previously mentioned.

Figure 3:
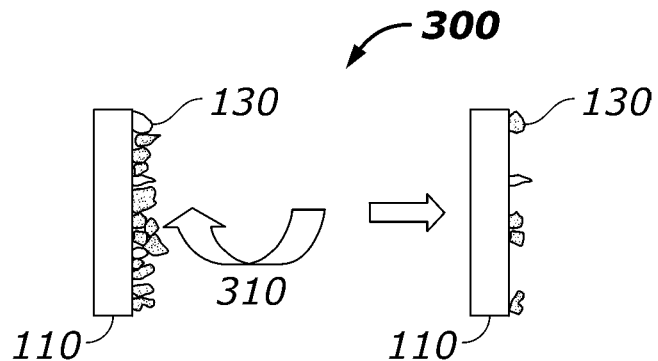
FIG. 3 provides a schematic for plasma cleaning of a metal surface.

Continuing with the figures, FIG. 3 provides a schematic illustrating bombardment of the surface layer on the metal, resulting in the removal of the surface impurity layer from the metal surface. Bombardment of plasma 310 or sputtering gas, in certain implementations, may yield a metal precursor 320 with remaining impurities 320 while clean metal is adhered to the surface of a substrate as previously described.

The clean lithium may then become a substrate for application of a protective material which may be applied to lithium to improve the performance of lithium in rechargeable batteries. The protective material may be deposited, as a coating, in contact with the clean metal surface. Other contemplated methods for depositing the protective material to the clean metal may include dipping or vapor deposition at room temperature. The clean lithium and the protective material may further be formed separately and laminated together. One of ordinary skill in the art will be able to determine other suitable means of depositing the clean metal which may encompass contacting a clean metal surface with the protective material without contaminating the metal. Any known inert environment, such as a glove box, for example, may be utilized to facilitate the treatment of clean metal.

Having described compositions and electrodes for use in electrochemical cells and processes of preparing thereof, the following describe possible aspects of such compositions and processes. These examples are not intended to limit the scope of any aspect or implementation of this disclosure or claims below, but rather are offered by way of illustration only. Therefore, one skilled in the art would understand that many conditions may be modified to produce a desired result, and it is intended that such modifications be within the scope of the present disclosure.

EXAMPLE 1

Approximately 1.0 to 1.5 g of lithium (Li) metal was placed in a Denton deposition chamber custom installed into VAC glove box and subjected to vapor deposition occurring at a pressure of approximately from $10^{-5}$ to $10^{-3}$ torr. Li metal was cleaned for approximately 2 minutes. 200 nanometers (nm) of lithium (Li) is deposited on electron beam (e-beam) nickel (Ni) substrate. The Ni substrate with clean Li was soaked for 15 seconds and subsequently, 6% soak power was applied for a soak period of approximately 1 minute. Following a rise to predeposit for approximately 1 minute, 6.5% predeposit power was applied. The Li is deposited on the Ni substrate at a rate of approximately 1 angstrom per second at a power of less than 10.6% deposition power.

EXAMPLE 2

The process for preparing clean lithium described below was performed in an argon filled glove box. The surface of battery grade lithium foil (available from FMC) was scraped. The scraped lithium was punched to a required size and diameter of an electrode to form a lithium electrode. To the lithium electrode in a container was added 20 mL tetraethyl orthosilicate (TEOS). The lithium electrode was turned over after approximately 2.5 minutes. After submerging the lithium electrode in the TEOS solution for more than 5 minutes, the lithium is removed from the solution. Cell assembly utilizing the resultant lithium is performed within 15 minutes.

EXAMPLE 3

Figure 4:
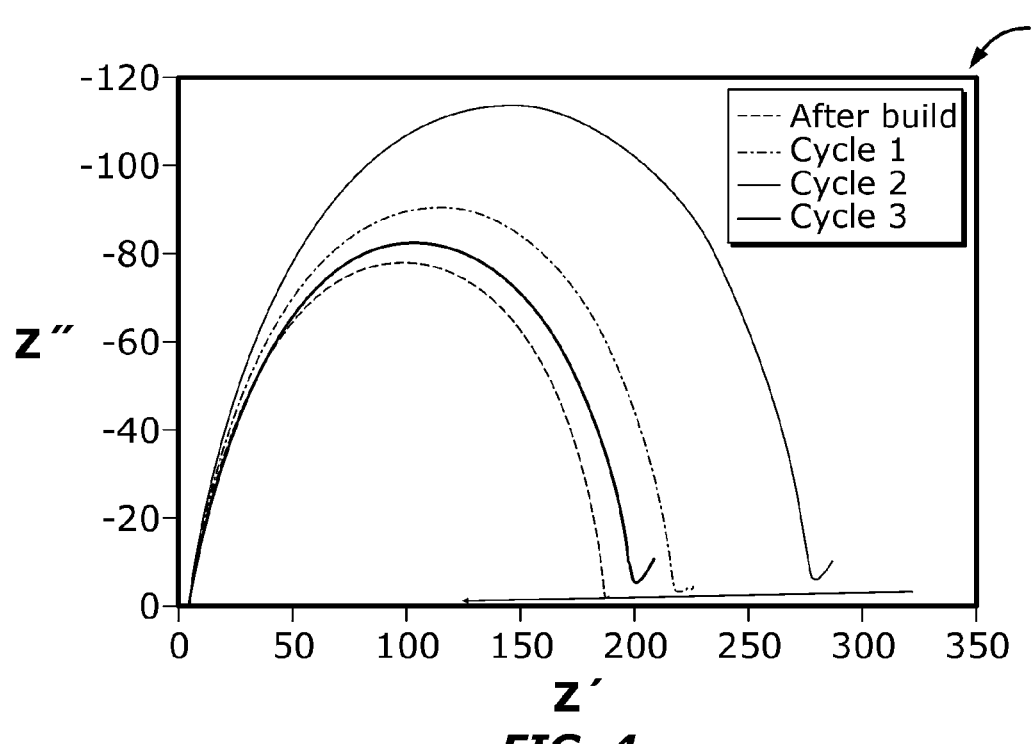
FIG. 4 provides impedance data for lithium metal precursor having undergone treatment with tetraethyl orthosilicate (TEOS)
Figure 5:
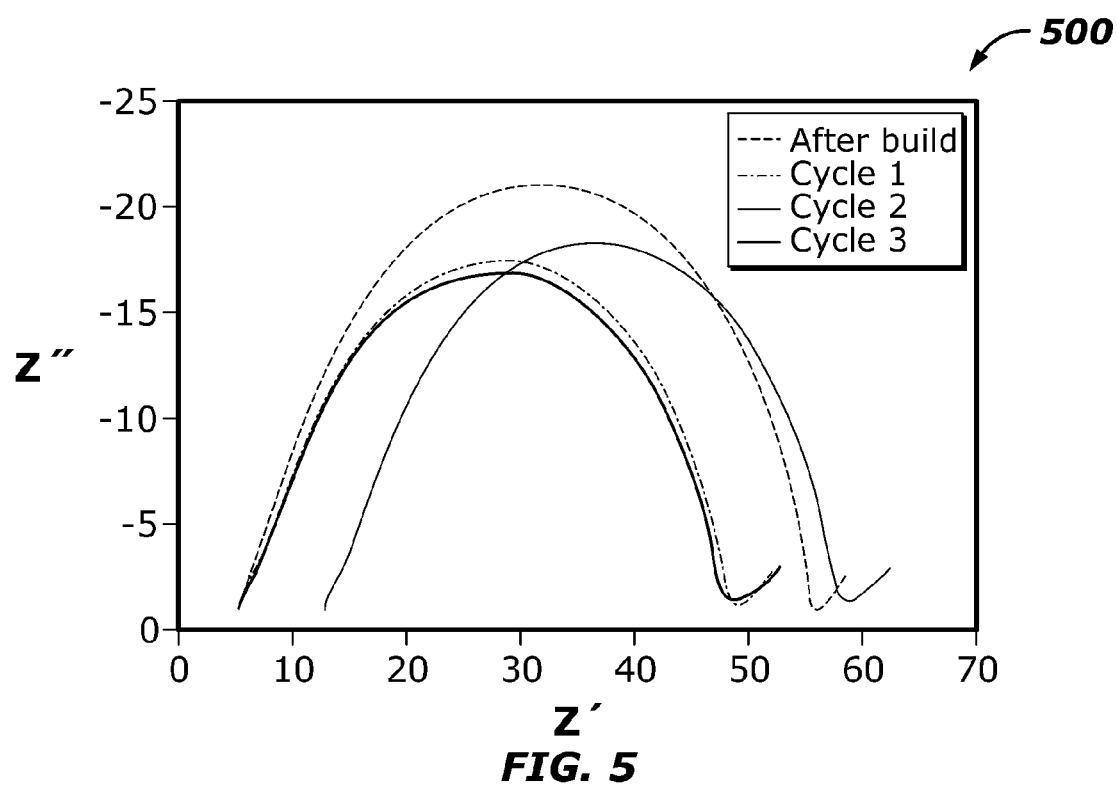
FIG. 5 provides impedance data for clean lithium having undergone treatment with TEOS.

As can be seen from FIG. 4, impedance of a typical electrochemical cell containing Li precursor treated with TEOS (as in Example 2) may decrease over successive charge/discharge cycles. In the case of an electrochemical cell utilizing a clean lithium electrode with a protective layer, initial impedance is lower as compared to that of a typical electrochemical cell, as shown in FIG. 5. Further, an electrochemical cell utilizing a clean lithium electrode may exhibit relatively constant impedance over successive charge/discharge cycles as compared to a typical electrochemical cell. This implies that the electrode surface area does not change during successive cycles and does not exhibit roughening.

The present disclosure provides a process for preparing a clean metal anode and applying a layer of protective material directly to the metal, resulting in a homogeneous or semi-homogeneous layer on the surface of the anode. As such, the layer of protective material allows more homogeneous current distribution and so allows the metal surface to remain relatively smooth during charge/discharge of the electrochemical cell. Generally, compositions and processes of the present disclosure may enhance properties of the electrochemical cell such as maintaining relatively constant impedance over successive charge/discharge cycles and improving the homogeneity of metal anode surfaces.

Although the present disclosure has been described with reference to particular examples, aspects and/or implementations, those skilled in the art will recognize that modifications and variations may be made without departing from the spirit and scope of the claimed subject matter. Such changes in form and detail, including use of equivalent functional and/or structural substitutes for elements described herein, fall within the scope of the appended claims and are intended to be covered by this disclosure.

What is claimed is:

1. A composition for use in an electrochemical cell, the composition comprising:
   a clean metal layer produced from removal of particles from a metal, the clean metal layer having a thickness greater than about 5 nanometers, wherein the clean metal layer is characterized by carbon content that is less than 20% carbon and/or oxygen content that is less than 10% oxygen;
   a layer of protective material in direct contact with the clean metal, wherein the layer of protective material has a thickness greater than 10 microns.

2. The composition of claim 1, wherein the dean metal is selected from the group consisting of lithium, sodium, magnesium and aluminum.

3. The composition of claim 1, wherein the protective material comprises an organic component, an inorganic component, or a combination thereof.

4. The composition of claim 3, wherein the organic component comprises a polymer selected from the group consisting of an ionically conductive polymer, sulfonated polymer, hydrocarbon polymer, vinyl polymer, cyanoacrylate based polymer, conjugated polymer, oxalate, polysiloxane, polyphosphagen, polytetrafluoroethylene, polyvinylpuridine, polyvinyl quinoline, poly-2-vinylpyridine, vinyl naphthalene, polyvinylidene fluorides, polyethylene oxide, vinylidene fluoride-hexafluoropropylene, tetrafluoroethylene-fluoropropylene, polychlorofluoroethylene, perfluoroalkoxy copolymer, polyfluorocyclic ether, polyacrylonitrile, polymethylmethacrylate, polyetherpolymeric, acrylate, polyacrylate, polyphosphazene, polyglycol, linear polymer and a derivative, combination, or copolymer thereof.

5. The composition of claim 3, wherein the inorganic component is selected from the group consisting of a silicate, borate, aluminate, iodide, bromide, chloride, nitride, sulfide, phosphate, carbonate, phosphorus oxynitride, titanium oxide, borosulfide, aluminosulfide, phosphosulfide, and a derivative or combination thereof.

6. The composition of claim 1, wherein the clean metal is formed by exposing a metal precursor to a sputtering gas to release the clean metal to be in contact with a substrate.

7. The composition of claim 1, wherein the clean metal is formed by heating a metal precursor to release the clean metal to be in contact with a substrate.

8. An electrochemical cell comprising:
   a metal film comprising a clean metal layer produced from removal of particles from a metal surface, the metal film having a thickness greater than about 5 nanometers, wherein the metal surface of the metal film is characterized by carbon content that is less than 20% carbon and/or oxygen content that is less than 10% oxygen;
   an electrolyte; and
   a layer of protective material in direct contact with the surface of the metal film, the protective material layer in direct contact with the electrolyte, wherein the layer of protective material has a thickness greater than 10 microns.

9. The electrochemical cell of claim 8 wherein the metal film comprises a metal selected from the group consisting of lithium, sodium, magnesium, and aluminum.

10. The electrochemical cell of claim 8, wherein the protective material comprises an organic component, inorganic component or a combination thereof.

11. The electrochemical cell of claim 10, wherein the organic component comprises a polymer selected from the group consisting of an ionically conductive polymer, sulfonated polymer, hydrocarbon polymer, vinyl polymer, cyanoacrylate based polymer, conjugated polymer, oxalate, polysiloxane, polyphosphagen, polytetrafluoroethylene, polyvinylpuridine, polyvinyl quinoline, poly-2-vinylpyridine, vinyl naphthalene, polyvinylidene fluorides, polyethylene oxide, vinylidene fluoride-hexafluoropropylene, tetrafluoroethylene-fluoropropylene, polychlorofluoroethylene, perfluoroalkoxy copolymer, polyfluorocyclic ether, polyacrylonitrile, polymethylmethacrylate, polyetherpolymeric, acrylate, polyacrylate, polyphosphazene, polyglycol, linear polymer and a derivative, combination, or copolymer thereof.

12. The electrochemical cell of claim 10, wherein the inorganic component is selected from the group consisting of a silicate, borate, aluminate, iodide, bromide, chloride, nitride, sulfide, carbonate, phosphate, phosphorus oxynitride, titanium oxide, borosulfide, aluminosulfide, phosphosulfide, and a derivative or combination thereof.

13. The electrochemical cell of claim 8, wherein the metal film is formed by exposing a metal precursor to a sputtering gas to release the clean metal in contact with a substrate.

14. The electrochemical cell of claim 8, wherein the metal film is formed by heating a metal precursor to release the clean metal in contact with a substrate.

15. A process for manufacturing an electrode, the process comprising the steps of:
   preparing a metal film comprising a clean metal surface layer that is produced from removal of particles from a metal surface, wherein the surface of the metal film is characterized by carbon content that is less than 20% carbon and/or oxygen content that is less than 10% oxygen; and
   depositing a layer of protective material in direct contact with the prepared metal film, wherein the layer of protective material has a thickness greater than 10 microns.

16. The process of claim 15 wherein the clean metal is selected from the group consisting of lithium, sodium, magnesium, and aluminum.

17. The process of claim 15, wherein the protective material comprises an organic component, inorganic component or a combination thereof.

18. The process of claim 17, wherein the organic component comprises a polymer selected from the group consisting of an ionically conductive polymer, sulfonated polymer, hydrocarbon polymer, vinyl polymer, cyanoacrylate based polymer, conjugated polymer, oxalate, polysiloxane, polyphosphagen, polytetrafluoroethylene, polyvinylpuridine, polyvinyl quinoline, poly-2-vinylpyridine, vinyl naphthalene, polyvinylidene fluorides, polyethylene oxide, vinylidene fluoride-hexafluoropropylene, tetrafluoroethylene-fluoropropylene, polychlorofluoroethylene, perfluoroalkoxy copolymer, polyfluorocyclic ether, polyacrylonitrile, polymethylmethacrylate, polyetherpolymeric, acrylate, polyacrylate, polyphosphazene, polyglycol, linear polymer and a derivative, combination, or copolymer thereof.

19. The process of claim 17, wherein the inorganic component is selected from the group consisting of a silicate, borate, aluminate, iodide, bromide, chloride, nitride, sulfide, carbonate, phosphate, phosphorus oxynitrides, titanium oxides, borosulfides, aluminosulfides, and phosphosulfides, and a derivative or combination thereof.

20. The process of claim 15 further comprising:
providing a substrate and wherein the step of preparing the metal film comprises exposing a metal precursor to a sputtering gas to release the clean metal in contact with a substrate.

21. The process of claim 20, wherein the substrate is selected from the group consisting of nickel, titanium, non-lithium alloy, and a combination thereof.

22. The process of claim 15 further comprising:
providing a substrate and wherein the step of preparing the metal film comprises heating a metal precursor to release the clean metal in contact with a substrate.

23. The process of claim 22, wherein the substrate is selected from the group consisting of nickel, titanium, non-lithium alloy, and a combination thereof.

* * * * *